United States Patent [19]

Schmidt

[11] Patent Number: 5,234,724
[45] Date of Patent: Aug. 10, 1993

[54] LOW ENERGY ION DOPING OF GROWING DIAMOND BY CVD

[75] Inventor: Howard K. Schmidt, Houston, Tex.

[73] Assignee: Schmidt Instruments, Inc., Houston, Tex.

[21] Appl. No.: 742,001

[22] Filed: Aug. 8, 1991

[51] Int. Cl.$^5$ .................... B05D 3/06; C23C 16/00
[52] U.S. Cl. .................... 427/530; 427/523; 427/569; 427/577; 427/249; 427/122; 423/446
[58] Field of Search ............... 427/38, 249, 122, 53.1, 427/35, 523, 530, 596, 569; 156/DIG. 68; 423/446; 250/492.3

[56] References Cited

U.S. PATENT DOCUMENTS

| | | | |
|---|---|---|---|
| 4,310,567 | 1/1982 | Tabata et al. | 427/82 |
| 4,385,946 | 5/1983 | Finegan et al. | 148/175 |
| 4,634,600 | 1/1987 | Shimizu et al. | 427/38 |
| 4,740,263 | 4/1988 | Imai et al. | 156/613 |
| 4,799,454 | 1/1989 | Ito | 118/723 |

FOREIGN PATENT DOCUMENTS 1-211848 8/1989 Japan.

OTHER PUBLICATIONS

Inagawa, "On the preparation of the hard films", J. Met. Finish Soc. Jpn. 39(2) Feb. 1988 pp. 54–63 (Abstract only).

G. Bajor and J. E. Greene, "Model calculations for accelerated As ion doping of Si during molecular beam epitaxy," J. Appl. Phys. 54(3) (Mar. 1983), pp. 1579–1582.

Y. Bamba et al, "Sn Ion Doping during GaAs MBE with Field Ion Gun," Japanese J. Appl. Phys., vol. 22, No. 6 (Jun. 1983), pp. L331–L332.

R. M. Chrenko et al, "Summary Abstract: p-type doping of Si molecular beam epitaxy layers using Ga liquid metal ion source," J. Vac. Sci. Technol. A4(3) (May/Jun. 1986), pp. 999–1000.

R. F. Davis, "Epitaxial Growth and Doping of and Device Development in Monocrystalline β-SiC Semiconductor Thin Films," Thin Solid Films 181 (1989), pp. 1–15.

M. W. Denhoff, et al, "In Situ doping by As ion implantation of silicon grown by molecular-beam epitaxy," J. Appl. Phys. 64(8) (Oct. 15, 1988), pp. 3938≅3944.

R. P. de Carvalho et al, "Silicon molecular beam epitaxy: Use of a microion source for doping by low-energy implantation," J. Vacuum Sci. Technol, B5(2) (Mar./Apr. 1987), pp. 515–517.

M. A. Hasan, "Incorporation of accelerated low-energy (50–500 eV) In+ ions in Si(100) films during growth by molecular-beam epitaxy," J. Appl. Phys. 65(1) (Jan. 1, 1989), pp. 172–179.

D. C. Houghton et al, "Ion Beam Doping of MBE Silicon by As+", J. Electrochem. Soc.: Solid-State Science and Technology (Dec. 1988), pp. 3109–3113.

H. Jorke et al, "Secondary implantation of Sb into Si molecular beam epitaxy layers," App. Phys. Lett. 47(5) (Sep. 1, 1985), pp. 511–513.

H. Jorke et al., "Improved Design Study for Doping by Secondary Implantation," J. Electrochem. Soc., vol. 136, No. 1 (Jan. 1989), pp. 254–258.

J. Knall et al, "Incorporation of In BY Recoil Implantation During MBE Growth of Si(100),", Elsevier Science Publishers B.V., pp. 149–164.

N. Ledentsov et al, "Influence of growth conditions on the implantation of background ions in doped GaAs films grown by molecular beam epitaxy," Sov. Phys. Tech. Phys. 30(1) (Jan. 1985), pp. 80–83.

(List continued on next page.)

Primary Examiner—Roy King
Attorney, Agent, or Firm—Pravel, Hewitt, Kimball & Krieger

[57] ABSTRACT

A diamond growing by chemical vapor deposition is exposed to a low energy beam of ionized dopant. The ion beam energy is sufficient to implant the dopant in the growing surface of the diamond. This doping method will work well for any dopant that is substantially immobile in the diamond at the temperature necessary for deposition growth.

10 Claims, 4 Drawing Sheets

OTHER PUBLICATIONS

J. Liu and D. Bellavance, "Summary Abstract: Characterization of ion implanted Si-molecular beam epitaxy film," *J. Vac. Sci. Technol.* B5(3) (May/Jun. 1987), p. 743.

E. Miyauchi et al, "Ion Species and Energy Control of Finely Focused FIBs Maskless In Situ Microfabrication Processes," *Instruments and Methods in Physics Research* B39 (1989) pp. 515–520.

E. Miyauchi and H. Hashimoto, "Application of focused ion beam technology to maskless ion implantation in a molecular beam epitaxy grown GaAs or AlGaAs epitaxial layer for three-dimensional pattern doping crystal growth," *J. Vac. Sci. Technol,* A4(3), (May/Jun. 1986) pp. 933–938.

E. Miyauchi and H. Hashimoto, "Maskless Ion Implantation System for Three-Dimensional Fine Doping Structures in III–V Compound Semiconductors," *Nuclear Instruments and Methods in Physics Research* B21 (1987) pp. 104–111.

W.-X. Ni et al., "Kinetics of dopant incorporation using a low-energy antimony ion beam during growth of Si(100) films by molecular-beam epitaxy," *Physical Review B,* vol. 40, No. 15 (Nov. 15, 1989), pp. 10 449–10 459.

Y. Ota, "n-Type Doping Techniques in Silicon Molecular Beam Epitaxy by Simultaneous Arsenic Ion Implantation and by Antimony Evaporation," *J. Electrochem. Soc.: Solid–State Science and Technology* (Oct. 1979), pp. 1761–1765.

A. Rockett, "Summary Abstract: Thermal and accelerated (<200eV) In doping of Si(100) layers during molecular beam epitaxy," *J. Vac. Sci. Technol.* A4(3), (May/Jun. 1986), pp. 900–901.

F. Schaffler and H. Jorke, "Gallium Doping of Silicon Molecular Beam Epitaxial Layers at Low Temperatures and Under $Si^+$ Ion Bombardment," *Thin Solid Films,* 184 (1990) pp. 75–83.

R. Swartz et al, "A technique for rapidly alternating boron and arsenic doping in ion-implanted silicon molecular beam epitaxy," *Appl. Phys. Lett.* 40(3), (Feb. 1, 1982), pp. 239–241.

R. Swartz et al, "In-Siut Low Energy $BF^+_2$ Ion Doping for Silicon Molecular Beam Epitaxy," *IEEE Electron Device Letters,* vol. EDL-3, No. 3 (Mar. 1982), pp. 138–140.

G. Yaron, "Characterization of Phosphorus Implanted Low Pressure Chemical Vapor Deposited Polycrystalline Silicon," *Solid–State Electronics,* vol. 22, (1979), pp. 1017–1024.

LOW ENERGY ION DOPING OF GROWING DIAMOND BY CVD

Government Rights

The U.S. Government has nonexclusive rights in this invention pursuant to contract number DASG60-90-C-80088 awarded by the Strategic Defense Initiative Organization of the U.S. Department of Defense.

FIELD OF THE INVENTION

This invention relates to the fabrication of doped material for use in electronic and optical devices and more particularly to the fabrication of diamond semiconductors.

BACKGROUND OF THE INVENTION

Diamond is a material with semiconductor properties that are superior to silicon (Si), germanium (Ge) or gallium arsenide (GaAs), which are now commonly used. In particular, diamond provides a higher band gap, higher breakdown voltage and greater saturation velocity, which produces a substantial increase in its cutoff frequency and a maximum operating voltage compared to devices fabricated from Si, Ge or GaAs. Furthermore, diamond has the highest of thermal conductivity of any solid at room temperature and excellent conductivity over a temperature range up to and beyond 500° kelvin. The diamond therefore holds potential for efficient semiconductor operation at high frequency and power.

Finally, diamond, by virtue of its small molecular size compared to other materials, provides a small neutron cross section which reduces its degradation rate in radioactive environments. Unfortunately, however, the advantages of diamond as a semiconductor have not been exploited for various reasons.

Although natural diamonds may be of device quality, they are of limited supply and size. Furthermore, most natural diamonds are insulators, and thus introduction, or doping, of electrically active impurities is required to render them useful as semiconductors. Doping by ion implantation has proved to be difficult in diamond. A review of this method may be found in Vavilov, et al "Electronic and Optical Processes in Diamond" copyright in 1975, Nauka, Moscow.

All prior art implantation doping of diamonds known to the present inventor have been high energy ion implantation, such as done routinely with silicon to produce semiconductors which are widely used in commerce. High energy ion implantation, however, causes lattice damage to the crystal. This damage is partially reparable, because the annealing temperature of diamond is above its graphitic conversation point. Complete conversion of the top 20% of the diamond file to graphitic material appears to be unavoidable. Such damage happens even when the implanted atom is smaller than carbon. It is likely that the damage would be much greater with doped ions like sodium or phosphorus, which are larger than carbon.

A second way to produce device quality diamonds is to synthesize them on a desirable substrate by chemical vapor deposition (CVD). In this technique, a gaseous mixture including a carbon supply, usually provided by methane and hydrogen, is pyrolized, or injected into a high frequency plasma, above the substrate surface. Radicals containing carbon react to produce diamond crystals on the substrate, while the hydrogen present is converted to atomic hydrogen, which preferentially etches away graphite and thereby leaves a film which is predominately diamond. This method allows for the possibility of doping by introducing electrically active impurities into the bulk environment above the substrate which are then trapped in the diamond lattices as the lattices are synthesized.

Using the prior art, only boron and nitrogen can be substitutionally grown into the diamond lattice reliably at low pressure. Boron has useful electrical activity, providing p- type material, while nitrogen has been found to be electrically inactive. The prior art has taught some efforts at producing n-type diamond through the introduction of phosphorus and alkali metals. Control over doping levels in the prior art has been very crude because chemical incorporation of impurities appears to be strongly dependant upon growth additions and the dopant feed stocks form long lived volatile residues in the growth chamber.

No prior art known to the present inventor allows the reliable production of both n and p type diamond doped with any desirable material without substantial lattice damage.

SUMMARY OF THE INVENTION

The invention is a method of producing doped diamond films. The diamond film is grown by chemical vapor deposition and the dopant is implanted into the film using a low energy ion beam. The implanted ions need only penetrate the diamond surface a few atomic layers so long as the implanted material is not substantially mobile in the diamond lattice at the growth temperature. This technique is useful for doping any material which may be grown by chemical vapor deposition (for example, diamond or cubic boron nitride). The dopant may be any material that is capable of being ionized and has limited mobility in the diamond lattice at the growth temperature. The inventor believes that his invention is a general method of doping materials grown by chemical vapor deposition. The energy of the ion beam must be low enough that it does not create substantial damage to the crystal lattice of the material being doped. The concentration of dopant is low, except directly over the material to be doped, thus preventing the buildup of undesirable deposits within the CVD growth chamber.

BRIEF DESCRIPTION OF THE DRAWINGS

A preferred embodiment of the present invention is described in the accompanying drawings, in which.

DESCRIPTION OF THE PREFERRED EMBODIMENT

Figure 1:
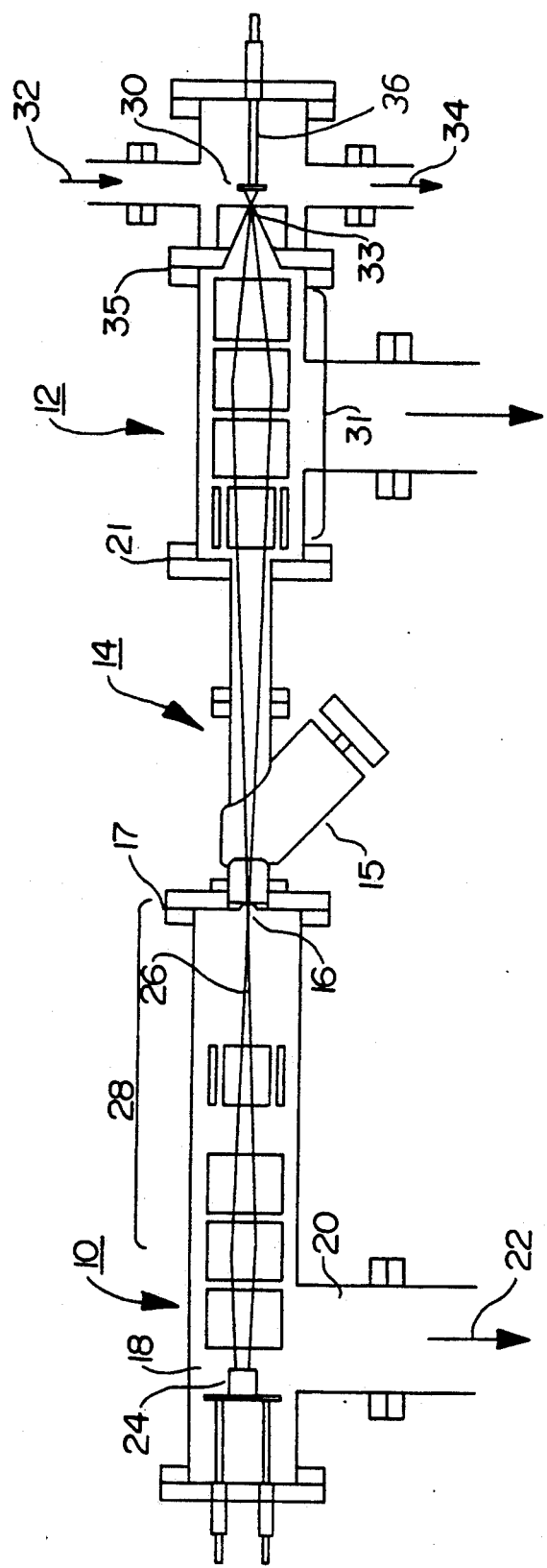
FIG. 1 is a schematic block diagram of the invention showing major elements.

FIG. 1 is a diagram showing the major elements of the device required to practice the method of the present invention. Ion beam forming means 10 and chemical vapor deposition growth chamber means 12 are joined by section 14, which contains ion beam aperture 16 and isolation valve 15. The joints are vacuum flanges 17 and 21.

Ion beam forming means 10 comprises a chamber 18 which contains a vacuum. Chamber 18 is connected by vacuum tube 20 to a source of high vacuum 22. Within chamber 18 is ion source 24, which is any convenient means of producing a supply of ions of the desired dopant, e.g. electron impact, ionization of a plasma, or any other means such as the liquid metal ion source taught below. Ion beam 26 from ion source 24 enter ion beam geometry and current control means 28 and then pass through aperture 16 in pressure separation section 14 and then through second beam geometry and current control means 31 and then through exit aperture 33, to impact on substrate 30 in CVD growth chamber means 12. The beam control means 31 is connected to the diamond growth cell by vacuum flange 35.

The growth chamber 12 has a hydrocarbon feed stock inlet 32 and an exhaust 34 and is provided with temperature control means 36 whereby the temperature of substrate 30 is maintained at the required level and the feed stock is maintained at the temperature required for chemical vapor deposition of the material, e,g. diamond.

The disclosure of the present invention is intended to teach a person of ordinary skill in the art in the field of ion beam generation and control and chemical vapor deposition how to make and use the best embodiment known to the inventor of his invention. It is not intended to be a mechanics handbook of each screw in the particular apparatus of the invention used in the experimental reduction of practice of this invention. Such detailed information is found in the SBIR Phase II proposal for contract number DASG60-90-C-0088 "N Type Diamond and Device Development" which has been placed in the patent office file wrapper of this application and all of the information in this report is incorporated herein by reference. The detailed information in this report is sufficient to allow anyone skilled in the art to build and operate the present invention.

The inventor understands that the present invention is a broad method and means for producing doped diamond films that avoids the drawbacks of either high energy ion implantation taught by the prior art or the chemical vapor deposition doping wherein the dopant is introduced into the bulk of the hydrocarbon feed stock. It is intended that the present invention may be used with any means of growing materials wherein the material is grown by deposition, e.g. physical vapor deposition, chemical vapor deposition, chemical beam deposition, vacuum epitaxy, halogen assisted CVD, plasma assisted CVD, thermal CVD, chemical beam epitaxy and/or atomic beam epitaxy, laser ablation deposition, molecular beam epitaxy, or any other method of growth of material by deposition.

All chamber components used for the present invention are preferably constructed from stainless steel, metal sealed conflat flanges, high purity alumina, OFHC copper and "MACOR". Ultra high vacuum (UHV) components and techniques, which are well known to anyone of ordinary skill in the art of this technology, are used throughout. The reduction to practice the present invention was accomplished with the ion orifice 16 and plate 14 being a 100 micron diameter orifice laser drilled in a stainless steel shim. The first high vacuum stage is evacuated preferably using a pump with throughput of one torr-liter per second and a pumping speed of 1000 liters per second. Under standard growth conditions at 10 torr, the diffusion pump maintains pressure in the low $10^{-4}$ torr range. In the experimental system used by the inventor for reduction of practice, ion source 24 is separated from the chamber 18 by a 1 mm aperture drilled in a solid copper gasket. The ion source is pumped by its own 50 liter per second ion pump, which allows the maintenance of pressures below $10^{-6}$ torr. The base pressure at the ion source is about $10^{-8}$ torr.

Figure 2:
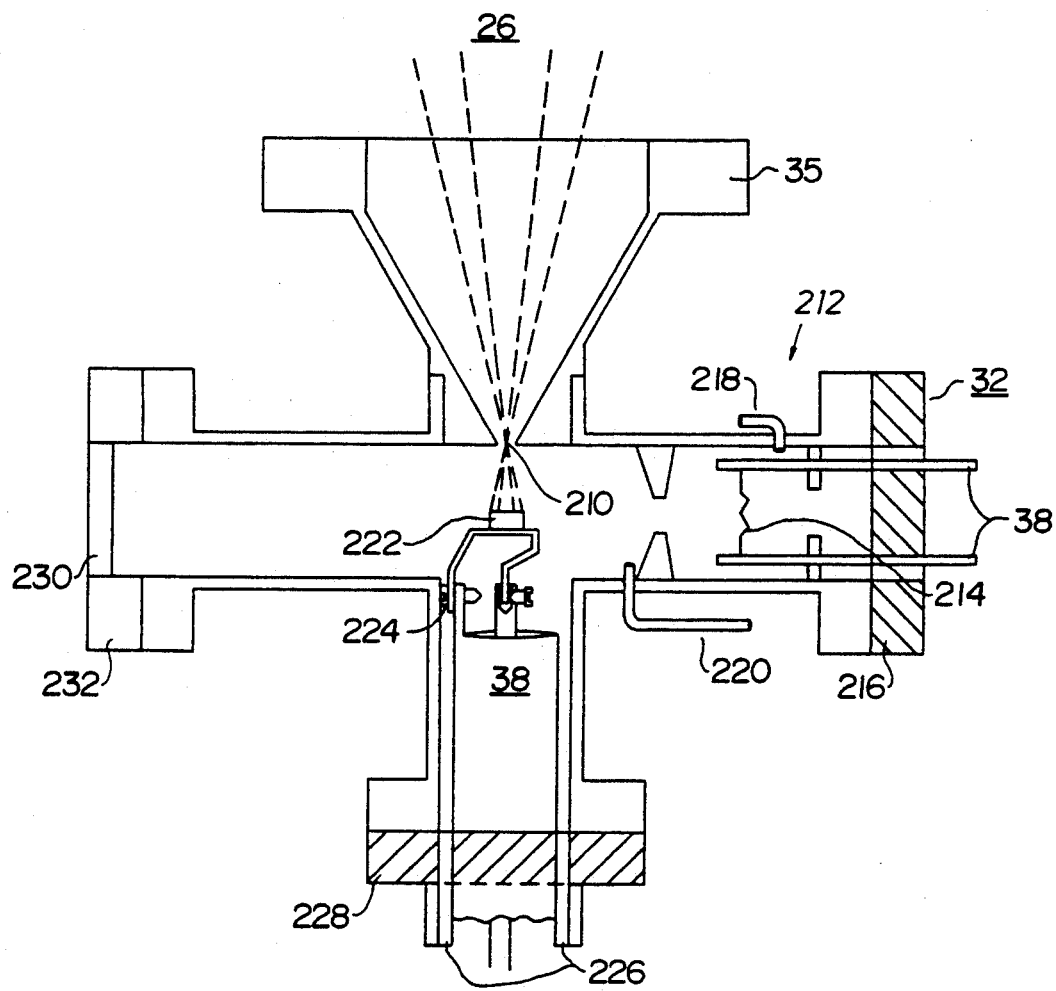
FIG. 2 is a cross section view of the diamond growth cell of the present invention.

FIG. 2 shows a cross section view of the diamond growth cell of the present invention.

In FIG. 2, ion beam 26 from beam control means 31 (not shown) passes through flange 35 and is focused to pass through beam aperture 210, which is preferably a 100 micron aperture. Gas supply section 212 has a filament assembly 214 including electric pass through means 38 in flange 216. A hydrogen gas inlet 218 is located upstream of filament 214 and a hydrocarbon gas inlet 220 is located downstream of filament 214.

Diamond growth substrate 222 is fixed to electric heater means 224, which is connected to a controllable source of electric power by lines 226 which pass through pressure flange 228. A pyrometer window 230 is set in pressure flange 232 so a pyrometer, not shown, may view filament 214 and substrate 222.

Functionally, a the hot gas flows over the substrate, diamond is deposited in the normal manner taught by the prior art of chemical vapor deposition. As the diamond film is growing, the ion beam is implanting dopant into the growing film. The dopant is implanted just below the surface of the growing film.

In one experimental embodiment of the invention described in FIG. 1, sodium ions were generated with a resistively heated zeolite which is obtained commercially from the firm "Spectra-Mat". The ion beam source 24 and the beam geometry and current control systems 28 and 31 were provided by the firm "Ionwerks" while the well know electrostatic lens used in this control means were driven by Bertan high voltage units. The beam deflection was controlled using commercially available Schmidt Instruments power supplies. The currents were measured at the various apertures as well as at the sample using Keithly picoammeters.

The growth cell 12 of the chemical vapor deposition growth of diamond film is fitted with high current feed through 38 to independently heat the diamond substrate and disassociator tungsten filament. All of this is well known to anyone who has done chemical vapor deposition of diamond growth work. These were driven using conventional variacs and step down transformers. Throughout the experimental production of the doped diamond by the present inventor by the method of the present invention, a substrate temperature close to 950° centigrade were employed. This temperature was monitored both by thermocouple and by a Leeds & Northrup disappearing filament pyrometer. Within the CVD means, filaments 0.010" in diameter and 3" in length were operated at 100 watts dissipated power to maintain a temperature well over 2,000° centigrade to disassociate hydrogen from the feed stock gas. Substrates which were polished 1.5 mm type IIA diamond (100) squares and sawn 2 mm square type IA diamond (110) squares obtained from the firm "Dubbeldee" were used as received as substrate material. The single crystal substrates were clamped to the support 36 by spot welding narrow tantalum strips over the opposing corners. The measurement thermocouple was spot welded to the rear of the support strap just behind the diamond crystal.

The deposition gas may be introduced separately or may be premixed before entering the growth chamber. This gas was methane (Matheson high purity) regulated with a Matheson mass flow controller and a hydrogen (Matheson UHP) was regulated with a calibrated rotameter. Total flow rate was always 100 SCCM, with methane content ranging from 0.5 to 2.0%. Pressure in the growth chamber was controlled by throttled mechanical vacuum pump.

The ion implant is performed, for example, using sodium ions with an initial energy of 7.5 KeV. From this energy, sodium ions are decelerated by the ten torr hydrogen atmosphere in growth cell 12 to an average of 600 eV. The ten torr growth medium caused sufficient beam bloom to irradiate a 3 mm area covering the entire sample without any need to raster the beam through the final aperture.

Once the test film had been exposed to the low energy ion beam during growth, it was removed from growth chamber 12 and titanium contacts were formed on the test film. The sample film was then subjected to conductivity tests to determine the electrical characteristics of the doped film. Van der Pau, Hall and Raman measurements were performed on the samples. Finally, an SIMS depth profile was run on the samples.

The Raman spectrum indicates excellent crystal quality in the sodium doped material, showing that the present invention avoids lattice damage. The SIMS depth profile show that doped material of high crystal quality was deposited successfully using the present invention on (110) diamond substrates. Growth was also observed on (100) diamond substrates, but this growth was not checked for dopant distribution by SIMS depth profile.

Figure 3:
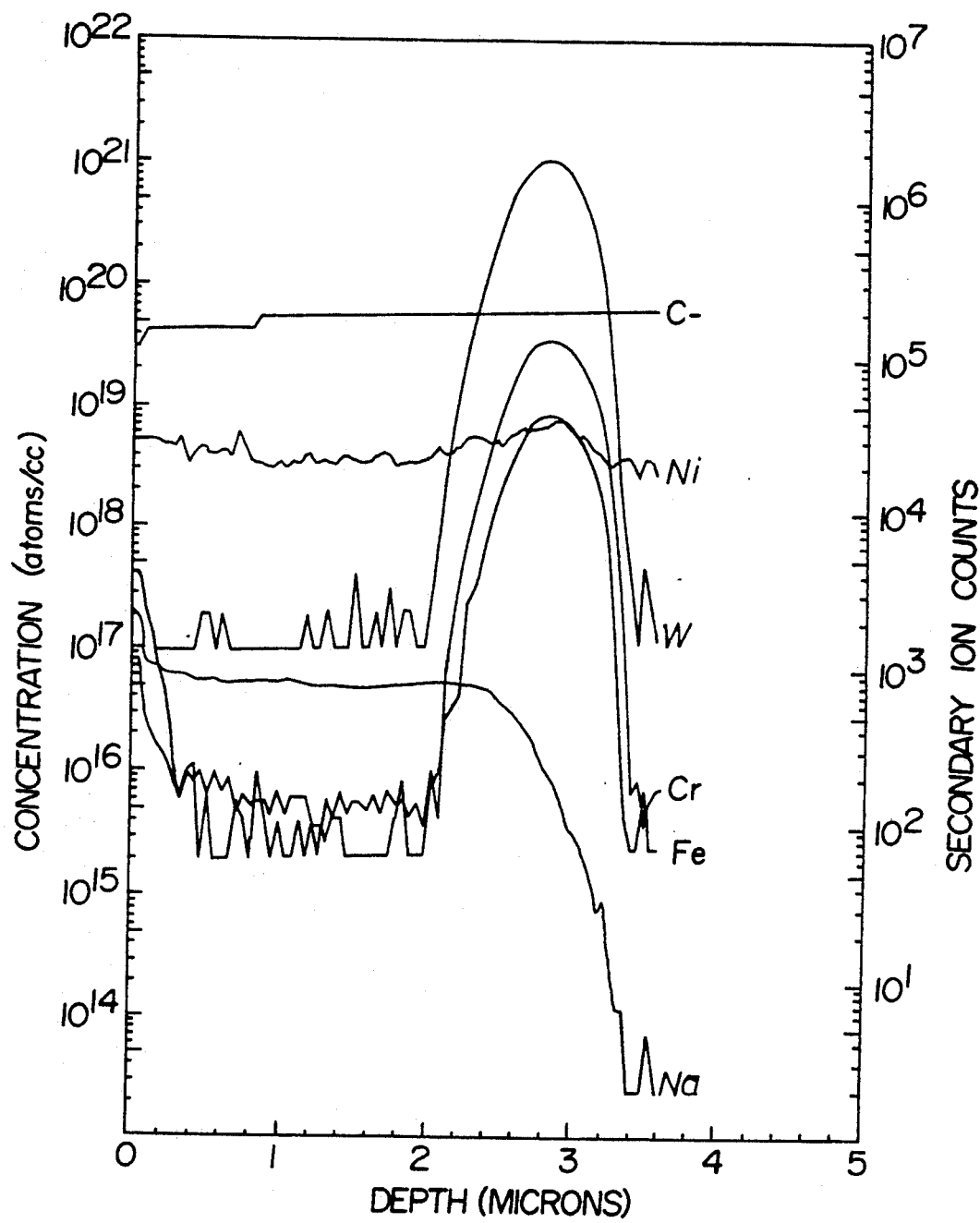
FIG. 3 is a SIMS depth profile from a diamond sample doped with sodium by the present invention.

FIG. 3 is the SIMS depth profile from (100) diamond sample doped sodium made by the present invention. It may be seen that the sodium trace rises clearly from below the detection limit in the underlying substrate to almost $10^{17}$ atoms per cubic centimeter at the surface. The other trace contaminates of W, Fe, Ni and Zr came from the filament, and from sputtering the beam aperture.

Figure 4:
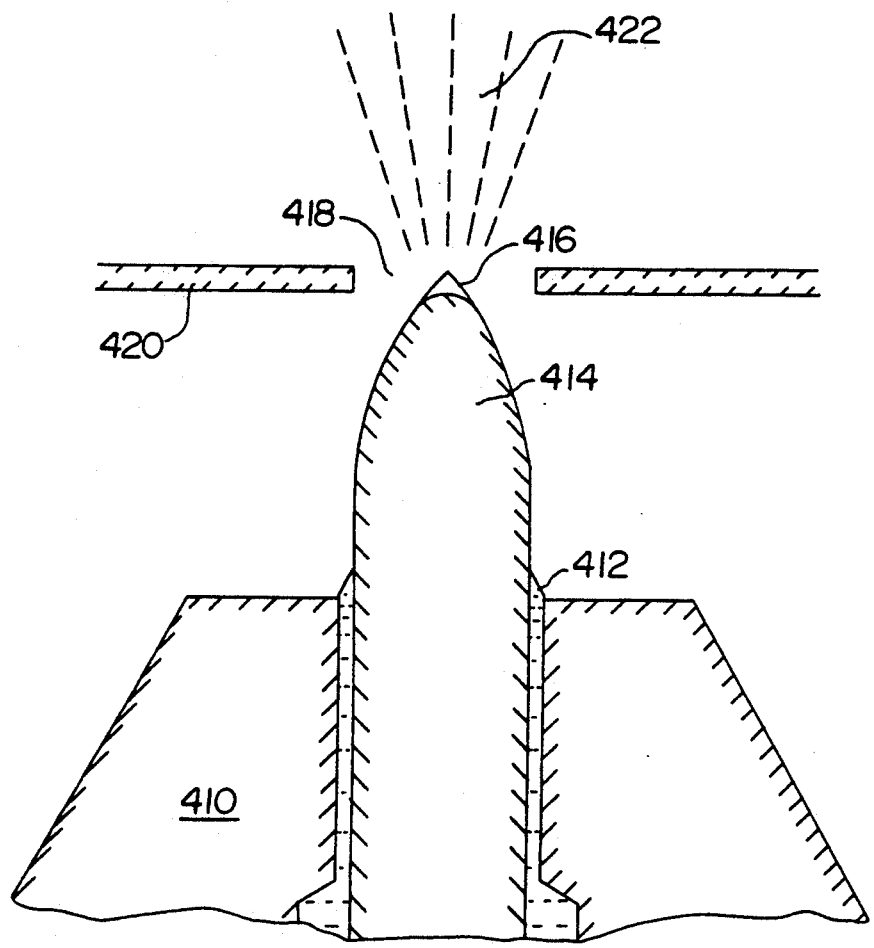
FIG. 4 is a liquid metal ion source used in the present invention.

FIG. 4 shows a liquid metal ion source for providing the ionized dopant for the present invention. If FIG. 4 a reservoir 410 of metal dopant, such as sodium, is heated to form a liquid metal film 412 on a needle emitter 414. The tip 416 of needle 414, which is covered with liquid metal 412, is proximate aperture 418 in extractor electrode 420. A 5 to 10 kilovolt electric potential is maintained between electrode 420 and the tip 416 of needle 414. This potential induces ion evaporation from the liquid dopant to form ion beam 422.

Such an ion source is desirable because of its simple construction, the wide range of metal and alloy dopants it may ionize, its small source spot size and high current brightness The present invention may also use an ion source that generates more than one type of ion, the different species being electromagnetically separated a the beam is formed.

The invention is a general means of introducing a dopant by means of a low energy ion implantation directly into the surface layers of a chemical vapor deposition grown film growing in a conventional growth chamber.

For example, the ion source could be atoms in the gas adjacent to the surface of the growing film. These atoms could be ionized by a laser beam in proximity to the film surface such that the ions would diffuse into the growing surface, either through thermal action or propelled by a charge on the film surface.

Alternatively, the implanted ions could be placed in the growing substrate by the method of recoil implantation. The inventor has deliberately not limited the invention to any particular embodiment. The ion source and beam control may be any convenient source of ions and any method of controlling a beam. The chemical vapor deposition growth chamber is a conventional device well known in the prior art. The invention is in the combination of these two well known technologies in such a way as to provide the ability to dope a diamond film with virtually any material which is capable of being ionized and has a limited motility within the crystal structure at the growth temperature.

It is the intent of the inventor, therefore, not to have his invention bound by the preferred embodiment given above and described in excruciating detail in the contract proposal incorporated by reference, which forms a part of this application, but rather to claim it as a general means and method of doping chemical vapor deposition grown materials.

Therefore, although the above embodiment is preferred and may be considered illustrative, it should not limit the invention. The invention should only be limited by the following claims.

What is claimed is:

1. A method of doping diamond as it is grown in a chamber by chemical vapor deposition on a substrate comprising:
   ionizing a dopant;
   forming an ion beam from the ionized dopant, the energy of the beam being selected to be high enough to implant the dopant in the diamond and low enough to avoid lattice damage, the geometry of the beam being formed to impact an area of the diamond; and
   impacting the ion beam onto the surface of the diamond while the diamond is growing by chemical vapor deposition.

2. A method as in claim 1 wherein the dopant is ionized in a chamber at a pressure which is different from the pressure in the chamber where the diamond is grown by chemical vapor deposition.

3. A method as in claim 1 wherein the substrate is diamond.

4. A method as in claim 1 wherein the dopant is selected to be trapped in diamond lattice as the diamond is grown.

5. A method as in claim 1 wherein the dopant is sodium.

6. A method as in claim 1 wherein the dopant is phosphorus.

7. A method as in claim 1 wherein the dopant ions are formed by heating a material containing the dopant.

8. A method as in claim 1 wherein the dopant ions are formed by a liquid metal ion source.

9. A method as in claim 1 wherein the ion source generates more than one ion and different ions are separated as or after the beam is formed.

10. A method as in claim 1 wherein the diamond is grown by plasma-assisted CVD.

* * * * *